United States Patent [19]

Smoot

[11] Patent Number: 4,498,001
[45] Date of Patent: Feb. 5, 1985

[54] TRANSIMPEDANCE AMPLIFIER FOR OPTICAL RECEIVERS

[75] Inventor: Lanny S. Smoot, East Orange, N.J.

[73] Assignee: AT&T Bell Laboratories, Murray Hill, N.J.

[21] Appl. No.: 401,521

[22] Filed: Jul. 26, 1982

[51] Int. Cl.³ .............................................. H01J 40/14
[52] U.S. Cl. ................. 250/214 A; 330/288; 330/308; 455/619
[58] Field of Search ....... 250/214 R, 214 A, 214 AG, 250/551; 330/278, 284, 288, 308; 455/600, 602, 608, 617, 619; 307/311

[56] References Cited

U.S. PATENT DOCUMENTS

| 3,968,361 | 7/1976 | Bumgardner | 455/619 X |
| 4,057,743 | 11/1977 | Limberg | 330/288 X |
| 4,104,533 | 8/1978 | Iverson | 250/551 |
| 4,415,803 | 11/1983 | Muoi | 250/214 AG X |

OTHER PUBLICATIONS

ACTA Electronica 22(4), 1979, "PIN Photodiode Receiver for Optical Fiber Digital Transmissions," pp. 329-334.

Primary Examiner—Edward P. Westin
Attorney, Agent, or Firm—Harry L. Newman; John K. Mullarney

[57] ABSTRACT

An improved transimpedance amplifier allows an optical transmitter and receiver to be in close proximity to each other without fear of overloading the receiver. The improvement increases the dynamic range of the transimpedance amplifier and thereby the operating range of the receiver. A peak detector (22) at the output of an inverting amplifier (11) within the transimpedance amplifier turns on a field effect transistor (FET) circuit (23) when an AC component of an electrical signal becomes so large that the inverting amplifier would otherwise go into saturation. The FET circuit (23) acts as an AC shunt impedance at the input of the inverting amplifier and diverts the excess AC current to ground (30). Also, the FET circuit (23) acts as a DC resistance in concert with sense and sink current mirrors (21) and (24) to effectively divert an excessive DC component of the electrical signal away from the input of the inverting amplifier (11). Although the dynamic range of the transimpedance amplifier is increased, the optical sensitivity and the performance of the receiver remain unchanged.

12 Claims, 3 Drawing Figures

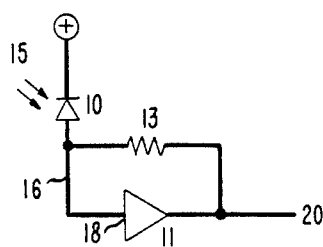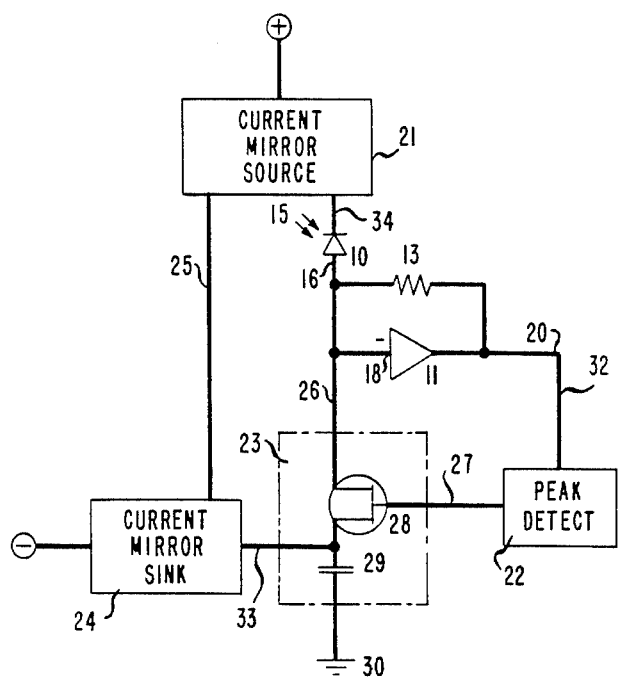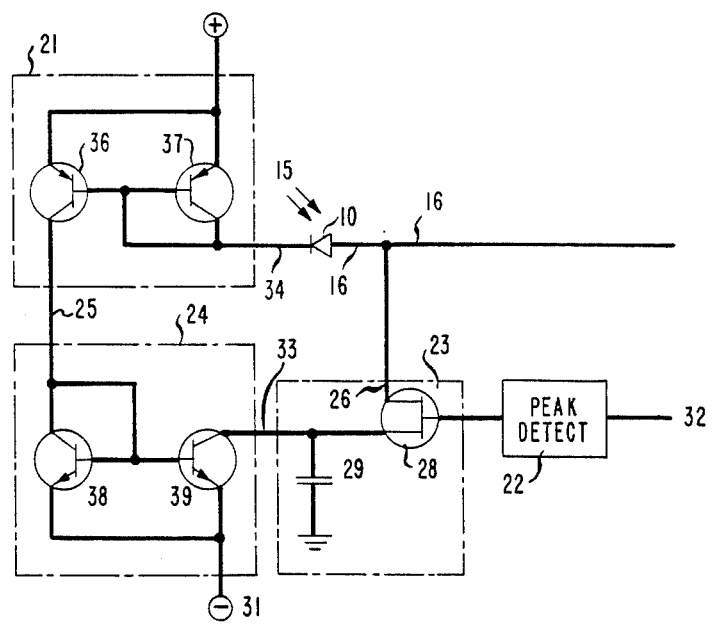

4,498,001

TRANSIMPEDANCE AMPLIFIER FOR OPTICAL RECEIVERS

FIELD OF THE INVENTION

This invention relates generally to optical receivers utilized in light guide systems and more particularly to the front end or transimpedance amplifier of an improved optical receiver to be used in conjunction therewith.

BACKGROUND OF THE INVENTION

Optical receivers are an integral part of light guide systems utilized for optical communications. Optical receivers generally have a limited dynamic range which in this instance is defined as the range of optical power between the minimum allowable level for a given system margin and the maximum level before overloading occurs. Oftentimes if the transmitters and receivers are to be located at fixed distances from each other, a translucent attenuator is placed within the optical fiber at a certain point in the transmission segment such that the received signal is within the dynamic range of the receiver.

The value of the attenuator is dependent upon the distance between the transmitter and receiver. Thus, if this distance changes a different attenuator should be inserted. This becomes impractical in a subscriber loop system in that when a customer moves from one place to another, the optical receiver also has to be relocated, thereby necessitating a corresponding change in the attenuator. A need is apparent, therefore, for an optical receiver that can operate efficiently and effectively without the use of these attenuators.

Heretofore, and as is now well known in the art, a certain optical distance was considered necessary between the transmitter and receiver to prevent overloading of the receiver and thereby allow for intelligible transmission. It is now also well known in the art that the dynamic range of a typical optical receiver is around 20 dBm and that the minimum signal that the receiver can reproduce intelligibly is around 50 dBm.

Finally, as is well known, optical receivers operate within the range of −30 dBm to −50 dBm. Thus the 20 dBm of dynamic range is at the low end or when the optical receiver and transmitter are the farthest distance apart from each other. And when the receiver and transmitter are at the "high" end or close together, overloading of the receiver generally occurs.

Heretofore, there have been attempts to improve the dynamic range of optical receivers. Oftentimes these attempts have required complex circuitry for implementation. Thus, there is a corresponding increase in cost associated with such circuitry which reduces the cost effectiveness of the solution.

SUMMARY OF THE INVENTION

In accordance with the present invention, the dynamic range of an optical receiver is increased by modification of the transimpedance amplifier contained therein. In an illustrative embodiment an improved amplifier comprises a photodiode, an inverting amplifier having an input which is connected to the photodiode, a peak detector the input of which is connected to the output of the inverting amplifier, a field effect transistor circuit the gate of which is connected to the output of the peak detector, and the drain of which is connected to the input of the inverting amplifier and the source of which is connected to one of two current mirrors. One mirror is connected to a positive source of voltage and has one leg connected to the photodiode. The second mirror is connected to a negative source of voltage and has one leg connected to the second leg of the first mirror and has its other leg connected to the source of the field effect transistor circuit.

The circuit operates in the following manner. The photodiode converts the optical signal to an electrical signal having both alternating current (AC) and direct current (DC) components. The DC component of the signal turns on a current mirror sense which is connected to one end of the photodiode. The current mirror sense through its operation turns on a current mirror sink which reproduces the same DC component and effectively sinks the current to a ground reference level. The current mirror sink is electrically connected to the FET circuit which in turn is connected to the input of the inverting amplifier. Through operation of the sink and sense current mirrors the DC components of the electrical signal is effectively diverted through the FET circuit to ground.

In addition, this FET circuit diverts a portion of the AC component of the electrical signal. This current enters the input of the inverting amplifier and is outputted as an AC voltage. This voltage is coupled to the peak detector where it is compared to a preset voltage contained therein. Ordinarily, the preset voltage in this embodiment corresponds to the normal saturation point of the amplifier. Before this saturation point is reached, however, the peak detector turns the FET on providing an AC impedance path for the electrical signal. Thus, the decreased impedance of the FET diverts the AC component to ground thereby preventing the amplifier from becoming saturated.

This invention thus improves the dynamic range of an optical receiver by diverting the AC and DC components of an electrical signal at the transimpedance amplifier as the transmitted optical signal becomes larger. By diverting the current components in this manner, it is insured that the amplifier is not operated above its saturation point. The input signal from an optical transmitter, therefore, in this invention does not overload the transimpedance amplifier of the optical receiver and the need for optical attenuators is avoided.

BRIEF DESCRIPTION OF THE DRAWING

FIG. 1 is a transimpedance amplifier of an optical receiver;

FIG. 2 is an embodiment of the improved transimpedance amplifier in block diagram form;

FIG. 3 is a schematic diagram of an embodiment of the current mirror sense and sink circuitry.

DETAILED DESCRIPTION

FIG. 1 is an embodiment of a typical transimpedance amplifier. This amplifier is often used in conjunction with optical receivers to provide electrical signals at the front end of the same. The amplifier of FIG. 1 comprises inverting amplifier 11 having an input 18 which is connected to a photodiode 10 via lead 16. Typically, this photodiode is a P-type, Intrinsic, N-type. Also connected in a feedback relationship with the amplifier 11 is a resistor 13. An input optical signal 15 is received by photodiode 10 which converts this signal to an electrical signal with AC and DC components. The electrical signal is inputted to the inverting amplifier 11 where it is amplified and obtained in inverted form at the output 20.

The transimpedance amplifier of FIG. 1 is limited in the amount of input current that it can handle by the parameters of the inverting amplifier. For example, there could be a large DC bias on the input signal that would overload the amplifier. In addition, the AC voltage swing at the input 18 could be so large that it saturates the amplifier 11. It would seem possible to shunt away some of the input current of the receiver by use of a resistive device at the input of the receiver. This becomes difficult because the optical receiver typically operates at frequencies (12 MHz for example) where many resistive elements act as capacitors. The feedback resistor 13 and photodiode 10 therefore have parasitic capacitance across them at the operating frequency. Also, there are stray capacitances associated with the amplifier 11. These capacitances cause the amplifier to act as an integrator at high frequencies rather than as an amplifier. Thus it is incumbent that these capacitances be minimized.

In my invention as seen in FIG. 2 the input current is shunted away by the use of a field effect transistor circuit 23. The field effect transistor (FET) circuit 23 has low capacitance at high frequencies and is used as the resistive element to shunt away input current. This scheme also incorporates current mirror circuits 21 and 24 for sensing and sinking the DC component of the electrical signal through the FET circuit 23. In effect, the FET circuit 23 serves two functions: (1) it acts as a large resistance which effectively shunts the DC component of the electrical signal and (2) it provides an AC impedance in response to signals from a peak detector 22 to be later described.

In addition to containing the elements of the amplifier described in FIG. 1, the improved transimpedance amplifier of FIG. 2 contains a peak detector 22 which detects the output voltage from the inverting amplifier 11. This detector 22 has its input end connected to the output 20 of amplifier 11 via lead 32 and its output end connected to the gate of FET 28 in FET circuit 23. The drain of FET 28 is connected to the input of amplifier 11 via lead 26 while its source is connected to capacitor 29 which acts as an AC ground for FET circuit 23.

In this embodiment the current mirrors 21 and 24 are utilized to sense and sink the DC component of the current respectively. One end of current mirror 21 is connected to V+ where it derives its supply voltage and has one of its legs 34 connected to photodiode 10, and the other leg 25 connected to current mirror 24. Current mirror 24 is connected to V- where similarly it derives its supply voltage. Its other leg 33 is electrically connected to the source of FET 28.

This improved transimpedance amplifier operates in the following manner to shunt the AC component of the electrical signal. It is well known that the AC component of the signal causes a voltage swing at the output 20 of the inverting amplifier 11. This voltage swing which increases with increasing optical signal levels is sensed by peak detector 22. The detector 22 compares the output voltage of the amplifier 11 to a preset reference voltage which corresponds to the normal saturation point of the amplifier 11. When the output voltage of the amplifier 11 approaches this saturation point, the peak detector begins turning on the FET 28 via lead 27. Typically, saturation points for inverting amplifiers are on the order of 0.1 V peak-to-peak.

The FET 28 when turned on acts as a variable AC impedance and diverts the input AC component of the electrical signal to ground 30 through capacitor 29. The AC component of the electrical signal that amplifier input 18 encounters, therefore, will not overload this amplifier because the signal is being partly diverted through the FET circuit 23 by operation of peak detector 22.

The FET circuit 23 also operates to divert the DC component of the electrical signal. Current mirror 21 is turned on by the DC component of the electrical signal from photodiode 10. The mirror 21 then provides a DC current proportional to the input photocurrent provided by photodiode 10. Those skilled in the art will recognize that the current mirror 21 causes the same current to flow in leg 25 that flows in leg 34. Leg 33 of current mirror 24 similarly has this current flowing in it and has an electrical connection to FET 28. Therefore, the FET 28 has this same DC component of input current flowing through it as the current sink mirror 24 thereby diverting all DC current to V-. Thus, all the DC input component diverted from the input of the amplifier 11 actually flows through FET 28 via lead 26. Typically, V- and V+ are -5 and 5 volts respectively. The operation of the current sense and sink mirrors can be better understood by referring to FIG. 3 which is a circuit diagram of the above-mentioned mirrors.

In FIG. 3 the current source mirror 21 comprises a matched pair of transistors 36 and 37 with their bases commonly connected together and to photodiode 10 via lead 34. Their respective emitters are also commonly connected to V+. The current sink mirror 24 comprises a pair of matched transistors 38 and 39 with their bases connected in the same way as transistors 36 and 37. Along with the common base connection between the transistors, the collector of transistor 38 is also connected to its base as well as to the collector of transistor 36 via lead 25.

Thus in operation the DC component of the input current from photodiode 10 turns on transistors 36 and 37 via their respective bases. Equal current thereafter flows through the emitter to collector portions of transistors 36 and 37 through their operation. Since a current is flowing through transistor 36, this same current flows through the leg 25, thereby turning on transistors 38 and 39. The current flowing through transistors 38 and 39 is the same in each transistor because they are a matched transistor pair. This DC current is the same as the current flowing through the FET 28. This current, therefore, flows from the FET 28 through lead 26 and through the current sink to V-. Thus the DC current in effect is diverted from the input of the amplifier by the use of this current mirror sense-sink circuitry and never enters the input of amplifier 11.

This modification of the transimpedance amplifier improves the dynamic range of the receiver by (1) diverting the DC component of the current through the FET circuit with the current mirrors as the sensing and sinking mechanism, and (2) by limiting AC component of the electrical signal by the use of a peak voltage detector and in conjunction with an FET circuit. This modification allows optical transmitters and receivers to be in closer proximity without fear of overloading the receiver. The circuit elements necessary for realization of the above described embodiments are readily implemented into a transimpedance amplifier. These improvements will increase the dynamic range of the transimpedance amplifier and at the same time will not appreciably affect the optical sensitivity of the receiver or its performance.

While this invention has been disclosed by means of specific illustrative embodiments, the principles thereof are capable of a wide range of modification by those skilled in the art within the scope of the following claims.

What is claimed is:

1. A transimpedance amplifier for converting an optical signal to an electrical signal comprising:
   an amplifying means with an input and output,
   means for receiving the optical signal and converting it to a current with AC and DC components, the optical receiving means being connected to the input of the amplifying means,
   means for comparing a voltage at the output of the amplifying means to a preset reference voltage,
   means responsive to the comparing means for providing an impedance between the input of the amplifying means and a ground reference level,
   means comprising a current mirror for sensing the DC component of the current,
   means comprising a current mirror responsive to the sensing means for diverting the DC component of the current away from the input of the amplifying means, through the impedance means, and
   the impedance means being responsive to the comparing means to divert the AC component of the current to ground.

2. The transimpedance amplifier of claim 1 in which the amplifying means comprises:
   an inverting amplifier with an input and an output,
   resistance means being connected in feedback relationship with the amplifier.

3. The transimpedance amplifier of claim 1 or 2, in which the optical receiving means is a photodiode.

4. The transimpedance amplifier of claim 1 in which the impedance means is a field effect transistor circuit (FET).

5. The transimpedance amplifier of claim 4 in which the FET circuit comprises:
   field effect transistor, a capacitor means, one end being connected to the FET and the other end being connected to ground for blocking the DC component and passing the AC component of current.

6. The transimpedance amplifier of claim 4 in which the comparing means is a peak detector.

7. A transimpedance amplifier for converting an optical signal to an electrical signal comprising:
   an amplifying means with an input and output,
   means for receiving the optical signal and converting it to a current with AC and DC components, the optical receiving means being connected to the input of the amplifying means,
   means for comparing a voltage at the output of the amplifying means to a preset reference voltage,
   means responsive to the comparing means for providing an impedance between the input of the amplifying means and a ground reference level,
   means comprising a current mirror for sensing the DC component of the current, and
   means comprising a current mirror responsive to the sensing means for diverting the DC component of the current away from the input of the amplifying means, through the impedance means.

8. An improved transimpedance amplifier for converting an incoming optical signal to a corresponding electrical signal comprising:
   a photodetector for receiving the optical signal and generating a corresponding electrical current with AC and DC components,
   an amplifier with an input connected to said photodetector and an output,
   means comprising a current mirror connected to the photodetector for sensing and sinking the DC component,
   means connected to the output of the amplifier for sensing the AC component,
   an impedance means which simultaneously provides an AC path responsive to the AC sensing means to divert the AC component away from the input of the amplifier and a DC path responsive to the DC sensing and sinking means to divert the DC component of the input current away from the input of the amplifier.

9. A transimpedance amplifier for converting an optical signal to an electrical signal at high frequencies comprising:
   an amplifying means with an input and output,
   a photodiode means coupled to the input of said amplifier means for receiving the optical signal and converting it to a current with AC and DC components,
   a peak detecting means for comparing a voltage at the output of the amplifying means to a preset reference voltage,
   a field effect transistor circuit means responsive to the detecting means for providing an AC impedance and DC resistance between the input of the amplifying means and a ground reference level,
   a current sense mirror means for sensing the DC component of the current,
   a current sink mirror means for diverting the DC component of the current away from the input of the amplifying means, through the field effect transistor circuit,
   the field effect transistor circuit being responsive to the peak detecting means when the voltage at the output of the amplifying means is approximately equal to the preset voltage thereby causing the field transistor circuit to become a variable AC impedance and diverting the AC component of the current to ground.

10. The transimpedance amplifier of claim 9 in which the amplifying means comprises:
    an inverting amplifier with an input and an output,
    resistance means connected in feedback relationship with the amplifier.

11. The transimpedance amplifier of claim 10 in which the photodiode is a P-type, Intrinsic, N-type (PIN) photodiode.

12. The transimpedance amplifier of claim 11 in which said field effect transistor circuit means comprises:
    a field effect transistor (FET),
    a capacitor means one end being connected to the FET and the other end being connected to ground for blocking the DC component and passing the AC component of current.

* * * * *